United States Patent
Weaver

(10) Patent No.: US 9,111,734 B2
(45) Date of Patent: Aug. 18, 2015

(54) SYSTEMS AND METHOD OF COATING AN INTERIOR SURFACE OF AN OBJECT

(71) Applicant: General Electric Company, Schenectady, NY (US)

(72) Inventor: Scott Andrew Weaver, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 72 days.

(21) Appl. No.: 14/093,871

(22) Filed: Dec. 2, 2013

(65) Prior Publication Data

US 2015/0114825 A1    Apr. 30, 2015

Related U.S. Application Data

(63) Continuation-in-part of application No. 14/068,436, filed on Oct. 31, 2013.

(51) Int. Cl.
*C23C 14/32*    (2006.01)
*H01J 37/34*    (2006.01)
*H01J 37/32*    (2006.01)

(52) U.S. Cl.
CPC ........... *H01J 37/3411* (2013.01); *C23C 14/325* (2013.01); *H01J 37/32568* (2013.01); *H01J 37/32614* (2013.01)

(58) Field of Classification Search
CPC ............. C23C 14/325; H01J 37/32568; H01J 37/32614
See application file for complete search history.

(56) References Cited

U.S. PATENT DOCUMENTS

| | | | |
|---|---|---|---|
| 4,179,351 A | 12/1979 | Hawton, Jr. et al. | |
| 5,026,466 A | 6/1991 | Wesemeyer et al. | |
| 5,103,766 A * | 4/1992 | Yoshikawa et al. ..... | 118/723 VE |
| 6,800,383 B1 | 10/2004 | Lakhotkin et al. | |

(Continued)

FOREIGN PATENT DOCUMENTS

| | | |
|---|---|---|
| EP | 1173629 B1 | 8/2003 |
| GB | 1587566 A | 4/1981 |
| KR | 2011007267 A | 6/2011 |

OTHER PUBLICATIONS

Lusk, D., et al. "A High Density Hollow Cathode Plasma PECVD Technique for Depositing Films on the Internal Surfaces of Cylindrical Substrates." Plasma Processes and Polymers 6.S1 (2009): S429-S432.

(Continued)

*Primary Examiner* — Jason M Berman
(74) *Attorney, Agent, or Firm* — Andrew J. Caruso

(57) ABSTRACT

A system for use in coating an interior surface of an object, the system including a vacuum chamber enclosure defining an interior cavity configured to receive the object, a first electrode positioned within the interior cavity of the vacuum chamber enclosure, and a second electrode positioned within the interior cavity such that a space between the first and second electrodes is at least partially defined by the interior surface of the object. The first electrode is fabricated from a first material and the second electrode is fabricated from a second material. The system includes an arc supply coupled to the first and second electrodes. The arc supply selectively vaporizes material from one of the first electrode and the second electrode when current is supplied from one of the first and second electrodes such that the vaporized material forms a layer of material on the interior surface of the object.

20 Claims, 5 Drawing Sheets

(56) References Cited

U.S. PATENT DOCUMENTS

| | | |
|---|---|---|
| 7,541,069 B2 * | 6/2009 | Tudhope et al. .............. 427/569 |
| 8,029,875 B2 | 10/2011 | Wei et al. |
| 8,038,858 B1 | 10/2011 | Bures et al. |
| 8,343,593 B2 | 1/2013 | Boardman et al. |
| 8,387,561 B2 | 3/2013 | Weaver et al. |
| 8,453,740 B2 | 6/2013 | Mohan et al. |
| 8,528,208 B2 | 9/2013 | Rebak et al. |
| 2008/0138529 A1 * | 6/2008 | Weaver et al. ................ 427/456 |
| 2012/0181177 A1 | 7/2012 | Yu et al. |

OTHER PUBLICATIONS

International Search Report and Written Opinion issued in connection with corresponding PCT Application No. PCT/US2014/063284 on Feb. 4, 2015.

* cited by examiner

SYSTEMS AND METHOD OF COATING AN INTERIOR SURFACE OF AN OBJECT

CROSS REFERENCE TO RELATED APPLICATIONS

This application is a continuation-in-part and claims priority to U.S. patent application Ser. No. 14/068,436 filed Oct. 31, 2013 for "SYSTEMS AND METHOD OF COATING AN INTERIOR SURFACE OF AN OBJECT", which is hereby incorporated by reference in its entirety.

BACKGROUND

The present disclosure relates generally to physical vapor deposition and, more specifically, to a system and methods for applying a coating directly to an interior surface of an object via cathodic arc deposition.

At least some known physical vapor deposition processes vaporize and deposit a target material onto surfaces of a workpiece to form a coating thereon. For example, in physical vapor deposition processes such as cathodic arc deposition, current is supplied to, and an electric arc is struck on a face of a target cathode to vaporize the target material from the face of the cathode. The vaporization of the cathode forms a cloud of highly ionized material that substantially fills an interior of a vacuum chamber. The coating is then formed on the workpiece by allowing the cloud to contact exposed surfaces thereof.

Generally, vaporization of a cathode in a vacuum environment forms a substantially uniform coating on the exposed surfaces of the workpiece. More specifically, at least some of the surfaces of the workpiece may be shielded such that only the exposed surfaces receive a coating thereon. However, the cloud of coating material will also deposit on an interior surface of the vacuum chamber. Moreover, cathodic arc deposition is a line-of-sight process such that only surfaces exposed to the cloud of coating material receive a coating thereon. As such, it is difficult to ensure that the coating material deposits on hard-to-reach surfaces of a workpiece, such as an interior surface thereof.

BRIEF DESCRIPTION

In one aspect, a system for use in coating an interior surface of an object is provided. The system includes a vacuum chamber enclosure defining an interior cavity configured to receive the object, a first electrode positioned within the interior cavity of the vacuum chamber enclosure, and a second electrode positioned within the interior cavity of the vacuum chamber enclosure such that a space between the first electrode and the second electrode is at least partially defined by the interior surface of the object. The first electrode is fabricated from a first material and the second electrode is fabricated from a second material. The system also includes an arc supply coupled to the first electrode and the second electrode, wherein the arc supply is configured to selectively vaporize material from one of the first electrode and the second electrode when current is supplied from one of the first and second electrodes such that the vaporized material at least partially forms a layer of material on the interior surface of the object.

In another aspect, a method of coating an interior surface of an object is provided. The method includes providing a vacuum chamber enclosure defining an interior cavity configured to receive the object, positioning the object within the interior cavity of the vacuum chamber enclosure, positioning a first electrode within the interior cavity of the vacuum chamber enclosure, and positioning a second electrode within the interior cavity of the vacuum chamber enclosure such that a space between the first electrode and the second electrode is at least partially defined by the interior surface of the object. The first electrode is fabricated from a first material and the second electrode is fabricated from a second material. The method also includes coupling an arc supply to the first electrode and the second electrode, and supplying current to one of the first electrode and the second electrode to selectively vaporize material from one of the first and second electrodes such that the vaporized material at least partially forms a layer of material on the interior surface of the object.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, Such ranges are identified and include all the sub-ranges contained therein unless context or language indicates otherwise.

Embodiments of the present disclosure relate to systems and methods that are used to apply a multi-layer coating directly to an interior surface of an object. More specifically, the interior surface of the object is coated via physical vapor deposition. In the exemplary embodiment, a vacuum chamber enclosure is provided and the object is positioned within the vacuum chamber enclosure. A first electrode and a second electrode are positioned within the vacuum chamber enclosure such that a space therebetween is at least partially defined by an interior surface of the object. The system also includes an arc supply that selectively vaporizes material from one of the first electrode and the second electrode. More specifically, the arc supply is electrically coupled to the first and second electrodes such that the first and second electrodes are selectively interchangeable between cathodic and anodic operational modes. As such, layers of first and second electrode materials are selectively applied over the interior surface of the object in the space between the first and second electrodes.

Figure 1:
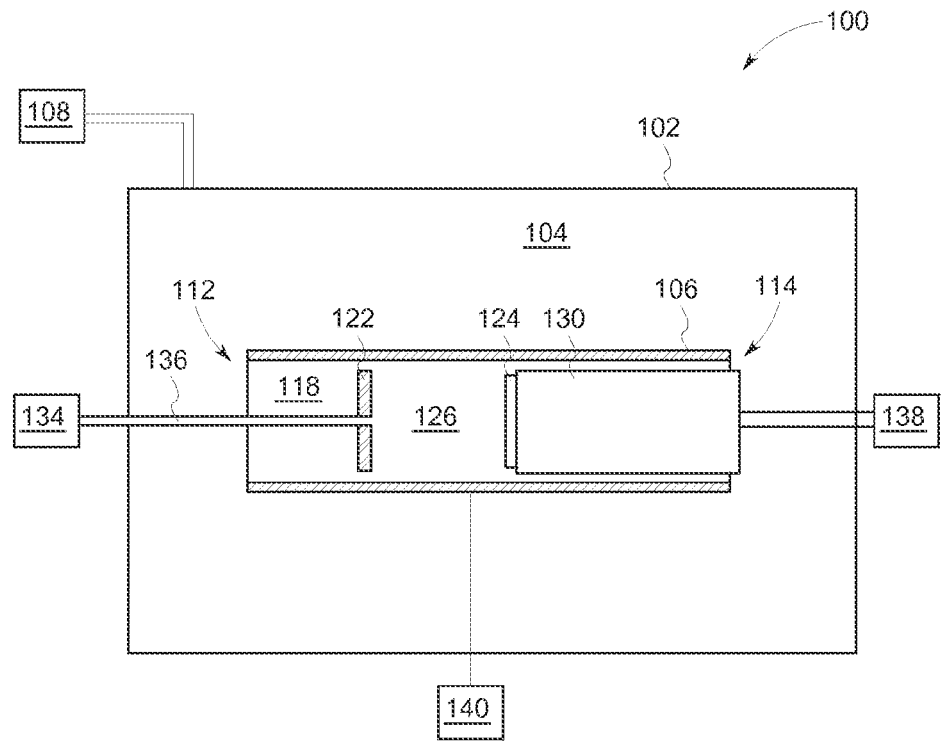
FIG. 1 is a schematic illustration of an exemplary physical vapor deposition system.
Figure 2:
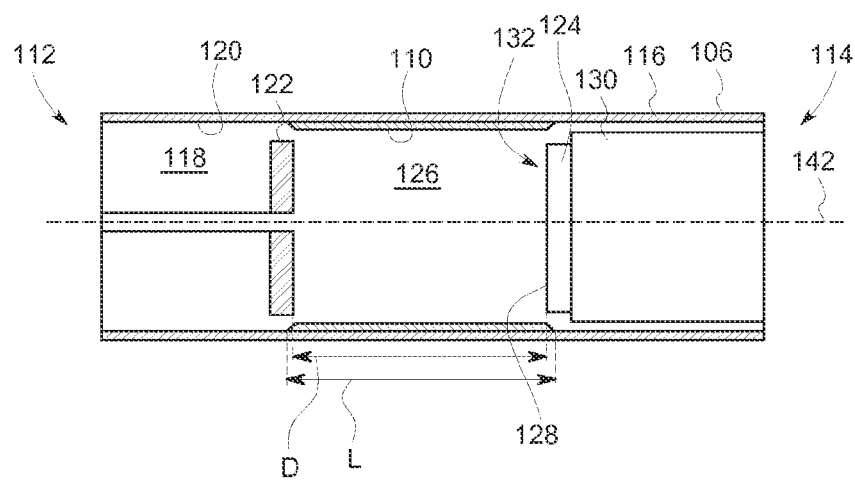
FIG. 2 is an enlarged sectional illustration of the physical vapor deposition system shown in FIG. 1.

FIG. 1 is a schematic illustration of an exemplary physical vapor deposition system 100, and FIG. 2 is an enlarged sectional illustration of physical vapor deposition system 100. In the exemplary embodiment, system 100 includes a vacuum chamber enclosure 102 defining an interior cavity 104 configured to receive an object 106 to be coated therein. Vacuum chamber enclosure 102 is coupled to a vacuum system 108 that facilitates creating a vacuum within vacuum chamber enclosure 102. In the exemplary embodiment, vacuum chamber enclosure 102 is evacuated to a pressure of between about $10^{-4}$ torr and about $10^{-5}$ torr during operation thereof. In an alternative embodiment, vacuum chamber enclosure 102 operates at a partial pressure atmosphere of reactive gas.

Object 106 is positioned within interior cavity 104 of vacuum chamber enclosure 102 to enable a coating 110 to be deposited thereon. In the exemplary embodiment, object 106 has a substantially cylindrical shape and includes a first open end 112, a second open end 114, and a side wall 116 extending therebetween. Object 106 also includes an interior cavity 118 and an interior surface 120 of side wall 116. Alternatively, object 106 has any shape that enables system 100 to function as described herein.

In the exemplary embodiment, system 100 also includes an anode 122 and a cathode 124 positioned within interior cavity 104 of vacuum chamber enclosure 102. Anode 122 and cathode 124 are positioned such that a space 126 is defined therebetween. More specifically, anode 122 and cathode 124 are positioned at opposing ends of object 106 such that space 126 is at least partially defined by interior cavity 118 and interior surface 120 of object 106. For example, anode 122 is sized for insertion through first open end 112 and into interior cavity 118 of object 106 with a clearance fit, and/or cathode 124 is sized for insertion through second open end 114 and into interior cavity 118 of object 106 with a clearance fit. As such, the clearance facilitates limiting the formation of a short circuit between interior surface 120 and anode 122 and/or cathode 124 during operation. Alternatively, anode 122 and cathode 124 are positioned at opposing ends of object 106, but are not inserted into interior cavity 118.

Anode 122 is fabricated from any material that enables system 100 to function as described herein. More specifically, anode 122 is fabricated from material that facilitates sustaining electrical discharge on a face 128 of cathode 124. For example, the material used to fabricate anode 122 is selected based on the material used to fabricate cathode 124, and a desired coating 110 to be applied to interior surface 120 of object 106. Exemplary materials include, but are not limited to, a metallic alloy material, an intermetallic material, and/or an elemental metal.

Cathode 124 is fabricated from any material that enables system 100 to function as described herein. More specifically, cathode 124 is fabricated from a coating material to be deposited on interior surface 120 of object 106. Exemplary coating materials include, but are not limited to, a metallic alloy material, an intermetallic material, and/or an elemental metal. Alternatively, cathode 124 is fabricated from more than one coating material. Moreover, in the exemplary embodiment, an insulator 130 extends over at least a portion of cathode 124 to facilitate sustaining electrical discharge on face 128 of cathode 124. More specifically, insulator 130 extends over cathode 124 such that electrical discharge is restricted from traveling off face 128 and away from anode 122. Moreover, insulator 130 covers cathode 124 such that an exposed portion 132 of cathode 124 is adjacent to and remains substantially unobstructed from anode 122. As such, maintaining line-of-sight between anode 122 and exposed portion 132 facilitates sustaining electrical discharge on face 128 of cathode 124.

In the exemplary embodiment, system 100 also includes a reactive gas source 134, and a reactive gas supply tube 136 coupled between reactive gas source 134 and anode 122. More specifically, reactive gas supply tube 136 facilitates channeling reactive gas (not shown) from reactive gas source 134, through anode 122, and into interior cavity 118 of object 106 at space 126 between anode 122 and cathode 124. Exemplary reactive gas includes, but is not limited to, nitrogen. The reactive gas is configured to interact with vaporized coating material from cathode 124 to deposit coating 110 fabricated from the interacted materials on interior surface 120 of object 106. In an alternative embodiment, supply tube 136 directs reactive gas towards space 126 through the clearance defined between anode 122 and/or cathode 124 and interior surface 120.

In operation, a vacuum is drawn in interior cavity 104 of vacuum chamber enclosure 102, and a power supply 138 supplies current to cathode 124 to form a difference in electric potential between anode 122 and cathode 124. An electric arc (not shown) is struck on face 128 of cathode 124 by an igniter (not shown), and the current supplied to cathode 124 facilitates vaporizing the coating material to remove the coating material from cathode 124. Power supply 138 supplies any current that enables system 100 to function as described herein. For example, the amount of current supplied is selected based on the coating material used to fabricate cathode 124 and/or a desired rate of vaporization of the coating material. In the exemplary embodiment, the amount of current supplied to cathode 124 is selected to facilitate restricting molten coating material from being discharged towards interior surface 120. For example, the current supplied to cathode 124 may be high enough to vaporize the coating material, but low enough to facilitate reducing molten coating material discharge.

In some embodiments, system 100 includes a voltage supply 140 that supplies a voltage bias to object 106. More specifically, in operation, voltage supply 140 facilitates inducing a negative charge to object 106 such that positively charged ions are attracted to object 106. As such, inducing the negative charge to object 106 facilitates attracting the positively charged vaporized coating material towards interior surface 120 of object 106 to form coating 110 thereon.

As current is supplied to cathode 124, reactive gas is channeled through supply tube 136 and into space 126 defined between anode 122 and cathode 124. As described above, the reactive gas interacts with the vaporized coating material from cathode 124 to form coating 110 on interior surface 120 of object 106. More specifically, coating 110 is formed on interior surface 120 in space 126 defined between anode 122 and cathode 124. Length L of coating 110 on interior surface 120 is determined as a function of a distance D between anode 122 and cathode 124. Distance D is selected as a function of sustaining electrical discharge on face 128 of cathode 124. Moreover, in the exemplary embodiment, at least one of object 106, anode 122, and/or cathode 124 are translatable relative to each other to facilitate forming coating 110 at different axial locations along a longitudinal axis 142 of object 106 in space 126 defined between anode 122 and cathode 124. In an alternative embodiment, the reactive gas is not channeled towards space 126 such that coating 110 is only formed from vaporized cathode material.

Figure 3:
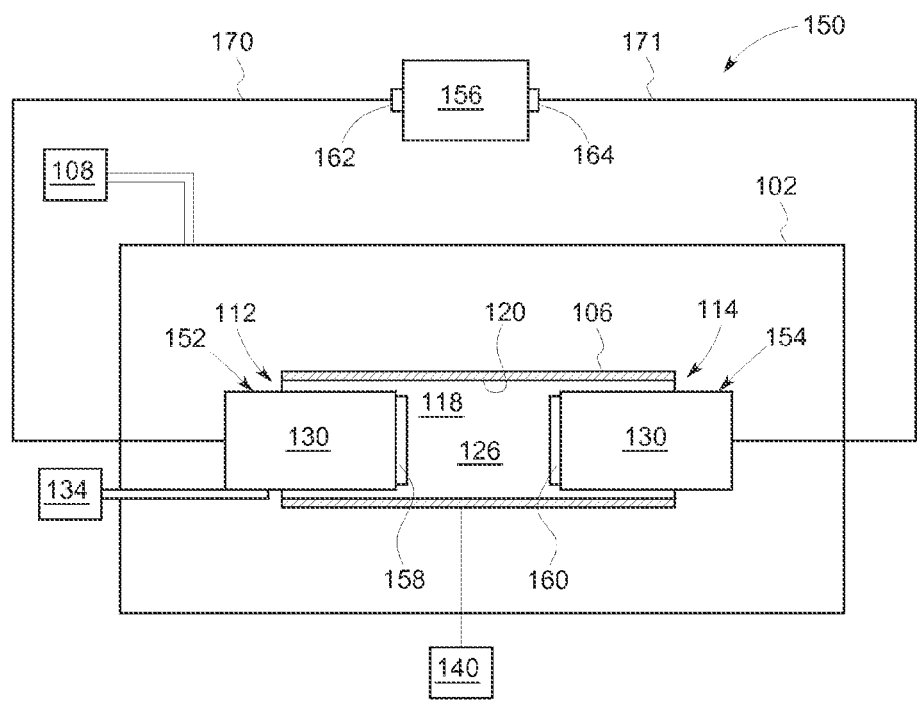
FIG. 3 is a schematic illustration of an alternative physical vapor deposition system.

FIG. 3 is a schematic illustration of an alternative physical vapor deposition system 150. In the exemplary embodiment, system 150 includes a first electrode 152, a second electrode 154, and an arc supply 156 coupled to first electrode 152 and second electrode 154. First and second electrodes 152 and 154 are positioned at opposing ends of object 106 such that space 126 is at least partially defined by interior cavity 118 and interior surface 120 of object 106. For example, first electrode 152 is sized for insertion through first open end 112 and into interior cavity 118 of object 106 with a clearance fit, and/or second electrode 154 is sized for insertion through second open end 114 and into interior cavity 118 of object 106 with a clearance fit. Alternatively, first electrode 152 and second electrode 154 are positioned at opposing ends 112 and 114 of object 106, but are not inserted into interior cavity 118.

First electrode 152 and second electrode 154 may be fabricated from any material that enables system 150 to function as described herein. In the exemplary embodiment, first electrode 152 is fabricated from a first material, and second electrode 154 is fabricated from a second material that is different than the first material. More specifically, the first and second materials are coating materials to be deposited on interior surface 120 of object 106. Exemplary coating materials include, but are not limited to, a metallic alloy material, an intermetallic material, and/or an elemental metal. Moreover, each electrode 152 and 154 includes insulators 130 extending over at least a portion of each respective electrode 152 and 154, thereby defining exposed portions 158 and 160 of respective electrodes 152 and 154. As such, exposed portions 158 and 160 of respective electrodes 152 and 154 remain substantially unobstructed from each other to facilitate maintaining a line-of-sight relationship between exposed portions 158 and 160.

In the exemplary embodiment, arc supply 156 selectively vaporizes material from one of first electrode 152 and second electrode 154 when current is supplied thereto. More specifically, material vaporizes from second electrode 154 when system is in a first operational mode 166, and material vaporizes from first electrode 152 when system is in a second operational mode 168 (not shown in FIG. 3). Arc supply 156 includes a first terminal 162 and a second terminal 164 that are coupled to first and second electrodes 152 and 154, respectively. Alternatively, first terminal 162 and second terminal 164 are coupled to second and first electrodes 154 and 152, respectively. Arc supply 156 supplies current to either first electrode 152 or second electrode 154 to form a difference in electric potential between first electrode 152 and second electrode 154. As such, system 150 is selectively interchangeable between first operational mode 166 and second operational mode 168 based on which of electrodes 152 and 154 current is being supplied to.

In the exemplary embodiment, system 150 is shifted between first and second operational modes 166 and 168 by any process that enables system 150 to function as described herein. More specifically, system 150 includes a first electrical coupling 170 coupled between a first terminal 162 of arc supply 156 and first electrode 152, and a second electrical coupling 171 coupled between a second terminal 164 of arc supply 156 and second electrode 154. Exemplary electrical couplings include, but are not limited to wires, cables, and busbars. In one embodiment, system 150 shifts between first and second operational modes 166 and 168 by either interchanging physical couplings 170 and 171 between terminals 162 and 164 and electrodes 152 and 154, or by maintaining physical couplings 170 and 171 and reversing the polarity at terminals 162 and 164.

Figure 4:
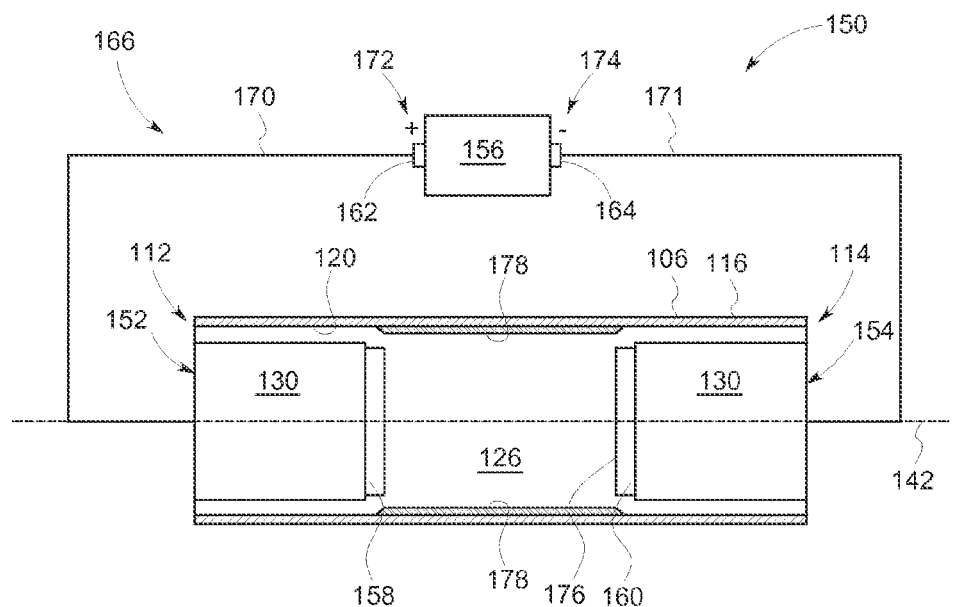
FIG. 4 is an enlarged schematic illustration of the physical vapor deposition system shown in FIG. 3 in a first operational mode.
Figure 5:
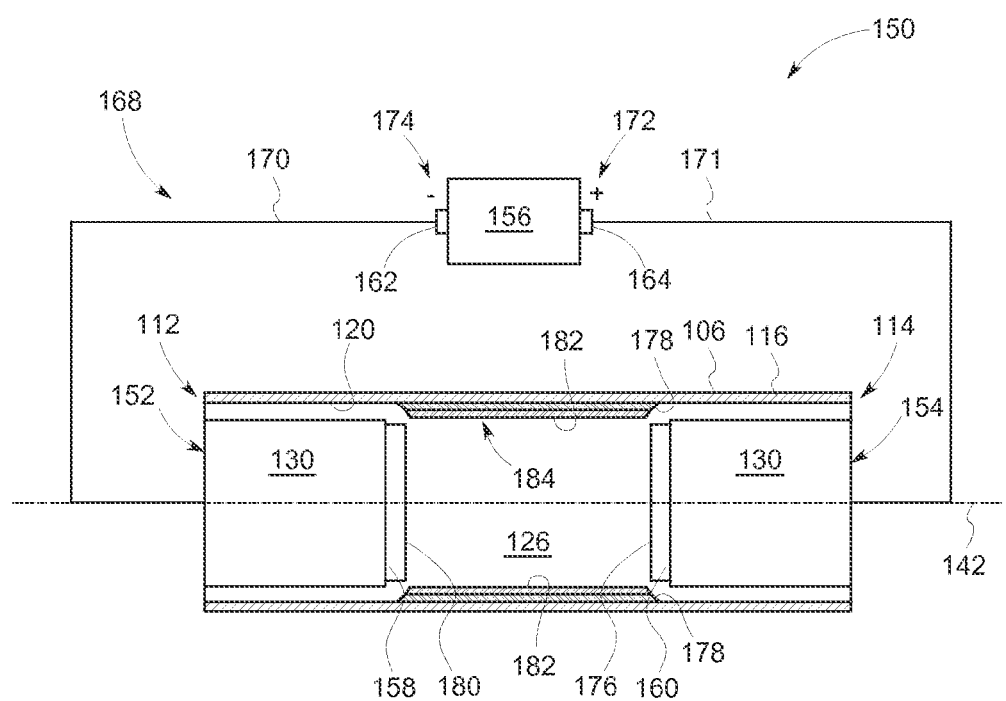
FIG. 5 is an enlarged schematic illustration of the physical vapor deposition shown in FIG. 3 in a second operational mode.

FIG. 4 is an enlarged schematic illustration of physical vapor deposition system 150 in first operational mode 166, and FIG. 5 is an enlarged schematic illustration of physical vapor deposition system 150 in second operational mode 168. In the exemplary embodiment, first and second electrodes 152 and 154 are selectively interchangeable between cathodic and anodic operational modes. More specifically, referring to FIG. 4, first terminal 162 of arc supply 156 is coupled to first electrode 152, and second terminal 164 is coupled to second electrode 154. In the exemplary embodiment, arc supply 156 is polarized such that first terminal 162 defines a positive terminal 172, and second terminal 164 defines a negative terminal 174. First electrode 152 is configured for anodic operation and second electrode 154 is configured for cathodic operation when system 150 is in first operational mode 166.

In operation, arc supply 156 supplies current to second electrode 154 to form a difference in electric potential between first electrode 152 and second electrode 154. An electric arc (not shown) is struck on a face 176 of second electrode 154 by an igniter (not shown), and the current supplied to second electrode 154 facilitates vaporizing at least a portion of second electrode 154 to remove the material therefrom. A layer 178 of second material is formed on interior surface 120 of object 106 in space 126 between first electrode 152 and second electrode 154.

As described above, system 150 is interchangeable between first and second operational modes 166 and 168. Referring to FIG. 5, when system 150 is in second operational mode 168, first terminal 162 is coupled to first electrode 152 and second terminal 164 is coupled to second electrode 154. In the exemplary embodiment, arc supply 156 is polarized such that first terminal 162 defines negative terminal 174, and such that second terminal 164 defines positive terminal 172. In this embodiment, first electrode 152 is configured for cathodic operation and second electrode 154 is configured for anodic operation when system 150 is in second operational mode 168.

In operation, arc supply 156 supplies current to first electrode 152 to form a difference in electric potential between first electrode 152 and second electrode 154. An electric arc (not shown) is struck on a face 180 of first electrode 152 by an igniter (not shown), and the current supplied to first electrode 152 facilitates vaporizing at least a portion of first electrode 152 to remove the material therefrom. A layer 182 of first material is formed at least partially over layer 178 of second material such that a multi-layer coating 184 is formed on interior surface 120 of object 106 in space 126 between first electrode 152 and second electrode 154.

In some embodiments, as described above, reactive gas source 134 (shown in FIG. 3) facilitates channeling reactive gas (not shown) into interior cavity 118 of object 106 at space 126 between first electrode 152 and second electrode 154. The reactive gas interacts with the vaporized coating material from first electrode 152 and/or second electrode 154 to form multi-layer coating 184 on interior surface 120. Alternating layers of vaporized coating material and vaporized coating material interacted with reactive gas may be formed on interior surface 120. Moreover, in the exemplary embodiment, at least one of object 106, first electrode 152, and/or second electrode 154 are translatable relative to each other to facilitate forming coating 110 at different axial locations along longitudinal axis 142 of object 106 in space 126 defined between first and second electrodes 152 and 154.

Figure 6:
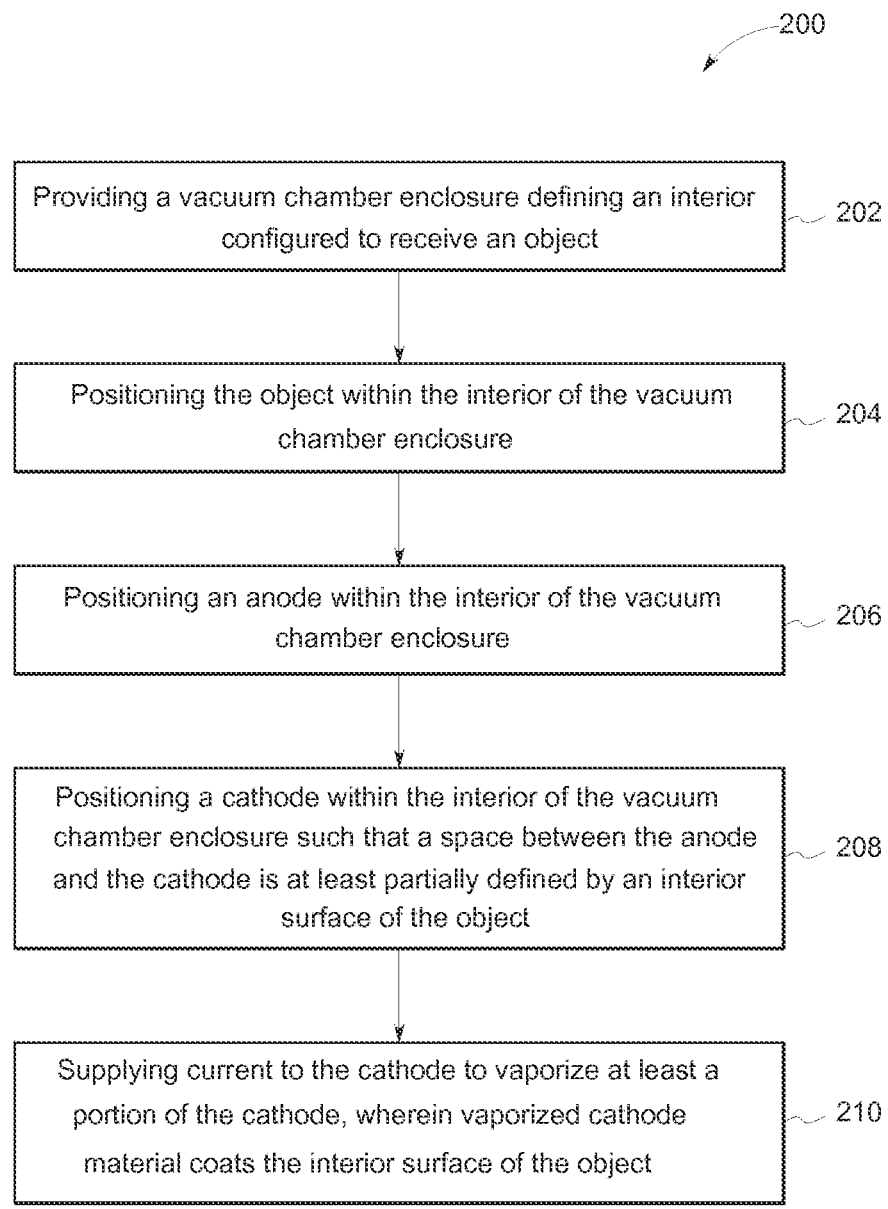
FIG. 6 is a flow diagram of an exemplary method of coating an interior surface of an object using the system shown in FIG. 1.

FIG. 6 is a flow diagram of an exemplary method 200 of coating an interior surface of an object, such as interior surface 120 of object 106 (shown in FIG. 1), is also provided herein. The method includes providing 202 a vacuum chamber enclosure defining an interior cavity configured to receive an object. The object is positioned 204 within the interior cavity of the vacuum chamber enclosure, an anode is positioned 206 within the interior cavity of the vacuum chamber enclosure, and a cathode is positioned 208 within the interior cavity of the vacuum chamber enclosure. The anode and the cathode are positioned 206 and 208 such that a space between the anode and the cathode is at least partially defined by the interior surface of the object. More specifically, the anode and cathode are positioned at opposing ends of the object such that the space is at least partially defined by the interior cavity of the object. Current is then supplied 210 to the cathode to vaporize material of the cathode. The vaporized material coats the interior surface of the object in the space between the anode and the cathode.

Figure 7:
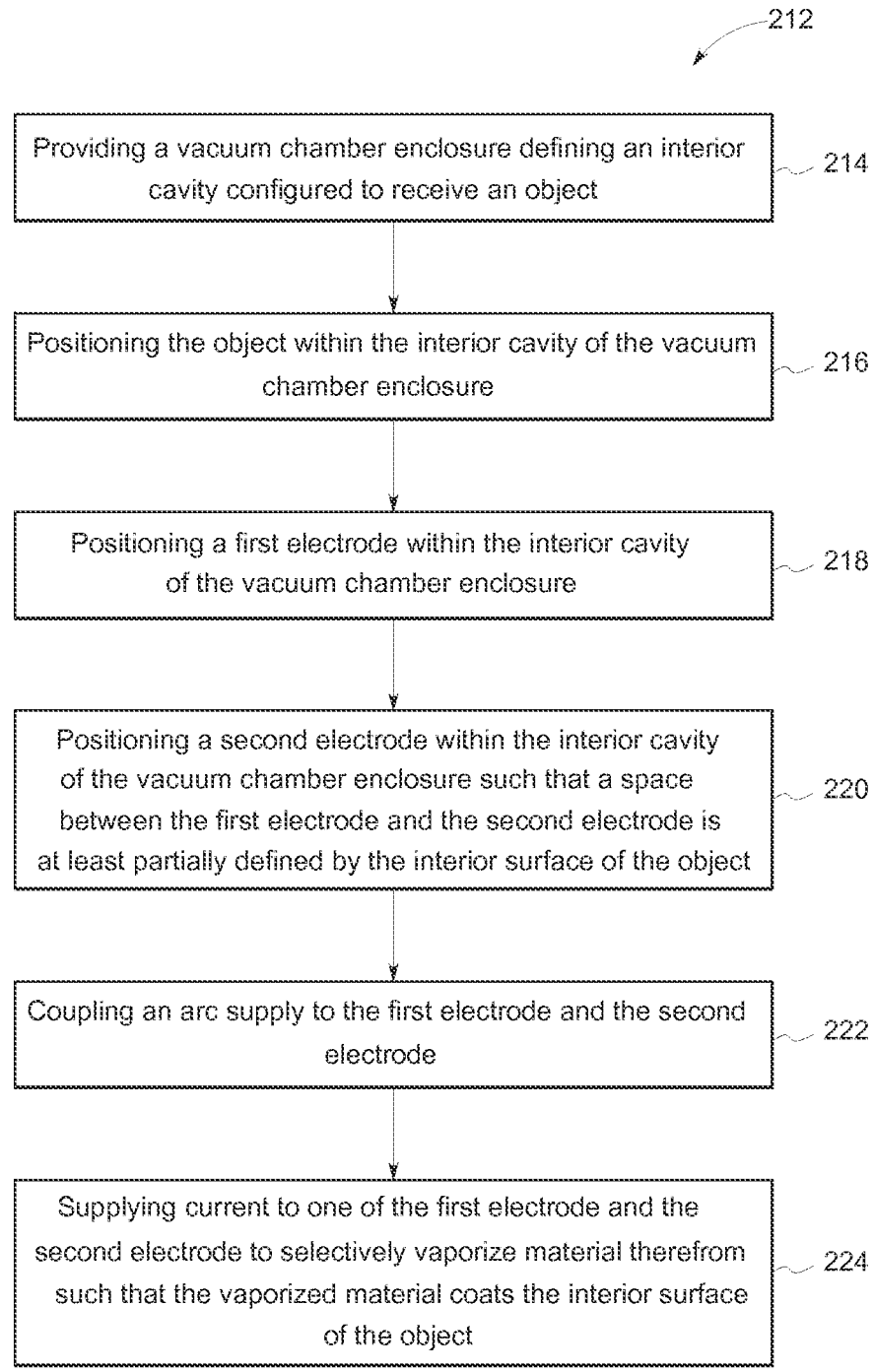
FIG. 7 is a flow diagram of an alternative method of coating an interior surface of an object using the system shown in FIG. 1.

FIG. 7 is a flow diagram of an alternative method 212 of coating an interior surface of an object, such as interior surface 120 of object 106 (shown in FIG. 3). The method includes providing 214 a vacuum chamber enclosure defining an interior cavity configured to receive an object. The object is positioned 216 within the interior cavity of the vacuum chamber enclosure, a first electrode is positioned 218 within the interior cavity of the vacuum chamber enclosure, and a second electrode is positioned 220 within the interior cavity of the vacuum chamber enclosure. The first electrode and the second electrode are positioned 218 and 220 such that a space between the first electrode and the second electrode is at least partially defined by the interior surface of the object. More specifically, the first electrode and the second electrode are positioned at opposing ends of the object such that the space is at least partially defined by the interior cavity of the object. An arc supply is coupled 222 to the first electrode and the second electrode, and current is supplied 224 to one of the first electrode and the second electrode to selectively vaporize material therefrom. The vaporized material coats the interior surface of the object.

The systems and methods described herein enable coating of an interior surface of an object using a physical vapor deposition process. In the exemplary embodiments, the systems described herein include a first electrode and a second electrode positioned at opposed ends of an object such that a space is defined therebetween. The space is also at least partially defined by an interior surface of the object. When current is supplied to one of the first electrode and the second electrode, the electrode material vaporizes and coats the interior surface in the space defined between the anode and the cathode. More specifically, one electrode is configured for cathodic operation, and the other electrode is configured for anodic operation. The system is then reconfigured to facilitate vaporizing material from the electrode previously configured for anodic operation. As such, a multi-layer coating fabricated from different materials is applied to a portion of the interior surface of the object in the space defined between the first electrode and the second electrode.

An exemplary technical effect of the methods, systems, and assembly described herein includes at least one of (a) enabling a multi-layer coating to be applied to hard-to-reach interior surfaces of an object; (b) reducing manufacturing costs by directing the coating material directly onto an interior surface of the object; and (c) reducing manufacturing time of coated objects by more efficiently coating interior surfaces of the objects.

Exemplary embodiments of the physical vapor deposition system are described above in detail. The system is not limited to the specific embodiments described herein, but rather, components of systems and/or steps of the methods may be utilized independently and separately from other components and/or steps described herein. For example, the system may also be used in combination with other physical vapor deposition processes, and are not limited to practice with only the physical vapor deposition process and methods as described herein. Rather, the exemplary embodiment can be implemented and utilized in connection with many applications where improving durability of an object with a coating is desirable.

Although specific features of various embodiments of the present disclosure may be shown in some drawings and not in others, this is for convenience only. In accordance with the principles of embodiments of the present disclosure, any feature of a drawing may be referenced and/or claimed in combination with any feature of any other drawing.

This written description uses examples to disclose the embodiments of the present disclosure, including the best mode, and also to enable any person skilled in the art to practice embodiments of the present disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for use in coating an interior surface of an object, said system comprising:
   a vacuum chamber enclosure defining an interior cavity configured to receive the object;
   a first electrode positioned within said interior cavity of said vacuum chamber enclosure, said first electrode fabricated from a first material;
   a second electrode positioned within said interior cavity of said vacuum chamber enclosure such that a space between said first electrode and said second electrode is at least partially defined by the interior surface of the object, said second electrode fabricated from a second material; and
   an arc supply coupled to said first electrode and said second electrode, wherein said arc supply is configured to selectively vaporize material from one of said first electrode and said second electrode when current is supplied to one of said first and second electrodes, wherein the vaporized material at least partially forms a layer of material on the interior surface of the object.

2. The system in accordance with claim 1, wherein said arc supply is configured to selectively vaporize at least a portion of said first electrode to form a layer of first material on the interior surface of the object, said arc supply is further configured to selectively vaporize at least a portion of said second electrode to form a layer of second material at least partially over the layer of first material.

3. The system in accordance with claim 1, wherein said arc supply comprises a first terminal and a second terminal coupled to one of said first electrode and said second electrode.

4. The system in accordance with claim 3, wherein said first terminal and said second terminal are interchangeably coupled between said first electrode and said second electrode to selectively vaporize material from one of said first electrode and said second electrode.

5. The system in accordance with claim 3, wherein said arc supply is configured such that a first polarity of said first terminal and a second polarity of said second terminal are selectively reversed to selectively vaporize material from one of said first electrode and said second electrode.

6. The system in accordance with claim 1, wherein at least one of said first electrode and said second electrode are sized for insertion through an open end of the object and into an interior cavity of the object.

7. The system in accordance with claim 6, wherein a clearance is defined between the interior surface of the object and said at least one of said first electrode and said second electrode when positioned in the interior cavity of the object.

8. The system in accordance with claim 1 further comprising a reactive gas source configured to channel reactive gas towards an interior cavity of the object.

9. The system in accordance with claim 8, wherein the reactive gas comprises nitrogen.

10. The system in accordance with claim 1, wherein the object includes a longitudinal axis extending along a length thereof, wherein at least one of said first electrode and said second electrode are configured to translate along the longitudinal axis.

11. A method of coating an interior surface of an object, said method comprising:
   providing a vacuum chamber enclosure defining an interior cavity configured to receive the object;
   positioning the object within the interior cavity of the vacuum chamber enclosure;
   positioning a first electrode within the interior cavity of the vacuum chamber enclosure, the first electrode fabricated from a first material;
   positioning a second electrode within the interior cavity of the vacuum chamber enclosure such that a space between the first electrode and the second electrode is at least partially defined by the interior surface of the object, the second electrode fabricated from a second material;
   coupling an arc supply to the first electrode and the second electrode; and
   supplying current to one of the first electrode and the second electrode to selectively vaporize material from one of the first and second electrodes such that the vaporized material at least partially forms a layer of material on the interior surface of the object.

12. The method in accordance with claim 11, wherein supplying current to one of the first electrode and the second electrode comprises:
   selectively vaporizing at least a portion of the first electrode to form a layer of first material on the interior surface of the object; and
   selectively vaporizing at least a portion of the second electrode to form a layer of second material at least partially over the layer of first material.

13. The method in accordance with claim 11, wherein coupling an arc supply comprises coupling each of a first terminal and a second terminal of the arc supply to one of the first electrode and the second electrode.

14. The method in accordance with claim 13, wherein coupling each of a first terminal and a second terminal comprises interchangeably coupling the first terminal and the second terminal between the first electrode and the second electrode to selectively vaporize material from one of said first electrode and said second electrode.

15. The method in accordance with claim 13 further comprising reversing a polarity of the first terminal and the second terminal to selectively vaporize material from one of the first electrode and the second electrode.

16. The method in accordance with claim 11 further comprising selecting a portion of the interior surface to be coated as a function of a location of at least one of the first electrode and the second electrode.

17. The method in accordance with claim 11 further comprising translating at least one of the first electrode and the second electrode relative to the object to form the layer of material on the interior surface at different axial locations along a longitudinal axis of the object.

18. The method in accordance with claim 11 further comprising channeling reactive gas towards the interior cavity of the object to react with the vaporized material.

19. The method in accordance with claim 18, wherein channeling reactive gas comprises channeling the reactive gas towards the space between the first electrode and the second electrode.

20. The method in accordance with claim 11 further comprising supplying a voltage bias to the object to facilitate attracting the vaporized material towards the interior surface of the object.

\* \* \* \* \*